United States Patent [19]

Oberreuter et al.

[11] 4,118,257

[45] Oct. 3, 1978

[54] METHOD FOR PRODUCING A SEMICONDUCTOR DEVICE HAVING MONOLITHICALLY INTEGRATED UNITS IN A SEMICONDUCTOR BODY

[75] Inventors: Theodor Oberreuter; Rigobert Schimmer; Wilhelm Seifert, all of Warstein, Fed. Rep. of Germany

[73] Assignee: LICENTIA Patent-Verwaltungs-GmbH, Frankfurt am Main, Fed. Rep. of Germany

[21] Appl. No.: 777,698

[22] Filed: Mar. 15, 1977

[30] Foreign Application Priority Data

Mar. 16, 1976 [DE] Fed. Rep. of Germany ....... 2610942

[51] Int. Cl.$^2$ .............................................. H01L 21/22
[52] U.S. Cl. .................................. 148/187; 29/577 R; 156/662; 148/33.5; 148/190; 357/39
[58] Field of Search ............. 148/187, 190, 33.5; 357/39; 156/662; 29/577 R

[56] References Cited

U.S. PATENT DOCUMENTS

| | | | |
|---|---|---|---|
| 3,146,135 | 8/1964 | Sah | 148/33.3 |
| 3,287,182 | 11/1966 | Kohl | 148/33.5 |
| 3,856,586 | 12/1974 | Borchert et al. | 148/190 X |
| 3,867,203 | 2/1975 | Gesing et al. | 148/190 X |
| 3,943,016 | 3/1976 | Marcotte | 148/187 X |

FOREIGN PATENT DOCUMENTS 2,360,081 12/1975 Fed. Rep. of Germany ........... 148/187

Primary Examiner—G. Ozaki
Attorney, Agent, or Firm—Spencer & Kaye

[57] ABSTRACT

A process for producing a semiconductor arrangement having elemental semiconductor units or devices monolithically integrated in a semiconductor body with the units having one or a plurality of common zones of one conductivity type with locally reduced thickness and pn-junctions between zones of different conductivity types. A groove is formed, by etching, in one major surface of the semiconductor body in the portion thereof above the region corresponding to the device which is to have the zone of reduced thickness with the depth of the groove being determined by the intended reduction in thickness of the common zone of the completed arrangement. The semiconductor body, which is provided with diffusion masking layers on both of its major surfaces except for a portion of one major surface in the region corresponding to the device which is to have the zone of reduced thickness, is then subjected at both of its surfaces to the simultaneous diffusion of an acceptor doping substance and donor doping substance, with one of the doping substances being of the type which is capable of diffusing through the material of the masking layer, in order to form zones of differing conductivity types in the semiconductor body.

12 Claims, 12 Drawing Figures

METHOD FOR PRODUCING A SEMICONDUCTOR DEVICE HAVING MONOLITHICALLY INTEGRATED UNITS IN A SEMICONDUCTOR BODY

BACKGROUND OF THE INVENTION

The present invention relates to a method for producing a semiconductor device having elemental semiconductor units monolithically integrated in a semiconductor body, with the units having a common or a plurality of common zones of one conductivity type with locally reduced thickness and pn-junctions between zones of different conductivity types. More particularly, the present invention relates to a method of forming such a semiconductor device wherein the method comprises producing the zone structures of the elemental units by diffusing doping substances into the semiconductor body from one and/or both major surfaces of the same in time stages with the use of a masking technique, wherein the masking layer is etched away by an etching medium at least at one major surface of the semiconductor body above the region of the semiconductor body in which the thickness of one zone of the device is to be reduced.

In a so-called thyristor with integrated diode made according to such a known process, e.g. see German Offenlegungsschrift (Laid Open Application) No. 23 60 081, a zone of the semiconductor body which is common to the two semiconductor units, i.e., the thyristor and the rectifying diode, advisably has a lesser thickness in the region of the diode than in the region of the thyristor. The respective common zone is, for example, n-conductive, and forms the anode side n-conductive base zone in the region of the semiconductor body forming the thyristor and the cathode side n-conductive base zone in the region of the semiconductor body forming the diode. This common n-conductive zone is adjacent, in the region of the semiconductor body forming the thyristor, to the p-conductive anode zone and, in the region of the semiconductor body forming the diode, to an $n^+$-conductive cathode zone which has a greatly reduced thickness in the dimension which determines the n-conductive base zone.

The zone structure of the known semiconductor device may be produced, for example, in the following proces steps. A wafer-shaped silicon semiconductor body of n-type conductivity is provided with an oxide layer on its two major surfaces and this oxide layer is covered by a photolacquer layer. Then the photolacquer layer is removed from one major surface above an annular edge region of the semiconductor wafer in which the thickness of the base zone of the diode is to be reduced, and thereafter the exposed portion of the oxide layer is etched away and the remainder of the photolacquer layer is removed. Into this semiconductor wafer, which has been thus prepared for the diffusion process and has been provided with an oxide masking layer, phosphorus is then diffused and the above-mentioned $n^+$ cathode zone is preshaped in the region of the diode. Thereafter, gallium is diffused into the wafer from both major surfaces through the masking layer and thus a pnp zone structure is formed in the region of the semiconductor wafer constituting the thyristor and the finished $n^+np$ diode structure with an $n^+$ cathode zone having a greater thickness is formed in the region of the wafer constituting the diode. After etching away a, for example, circular mask opening in the previously closed oxide layer of the other major surface of the wafer, phosphorus is finally again diffused into the wafer to form the $n^+$ cathode zone of the thyristor.

In this process the diffusion step to form a sufficiently thick $n^+$ cathode zone for the diode, which step takes place at high temperature, takes a very long time, for example about 50 hours, which has certain drawbacks. For example, a faulty oxide masking layer can have particularly disadvantageous effects. Moreover, in this process the life time of the charge carriers is reduced to an undesirable degree.

SUMMARY OF THE INVENTION

It is therefore the object of the present invention to provide a process for producing a semiconductor device with elemental semiconductor units which are monolithically integrated in the semiconductor body, which process is easily managed without requiring long diffusion times and which can also be used within the basic process mentioned above.

This is accomplished by the present invention in that prior to any diffusion operations and on at least one major surface of the semiconductor body which has been provided with a prepared diffusion masking layer, a groove is etched, with a etching means, in the region of the semiconductor body which is to contain the conductivity type zone of reduced thickness in the finished device and with the etching depth of the groove being determined according to the predetermined localized reductions in thickness of a common zone of the elemental semiconductor units as they exit after the diffusion process, and that the semiconductor body is then subjected to a simultaneous diffusion of an acceptor and of a donor doping substance, with one of said doping substances being the type for which the material of said masking layer is not an effective diffusion mask, e.g. gallium, so that diffusion occurs in a known manner simultaneously from both major surfaces of the semiconductor body.

In order to etch out the groove or grooves, a further feature of the invention provides that an etching medium be employed which has an etching rate for the basic material (for example silicon) of the semiconductor body many times stronger than its etching rate for the masking layer material, e.g., silicon oxide.

The above object can further be accomplished with a process modified according to the invention in that the groove or grooves are provided with a dense diffusion masking layer immediately after etching and that thereafter the masking material is etched away with the etching medium on the zone forming the other major surface at those points which are disposed opposite to the first grooves, the etching starting at the opposite major surface of the semiconductor body. Only then will the diffusion of the acceptor and of the donor doping substances be effected simultaneously from the two major surfaces of the semiconductor body.

According to a still further modification of the invention, after etching of the groove in one major surface of the semiconductor body a dense diffusion masking layer is formed on the surface thereof, as well as on the remainder of both major surfaces of the semiconductor body if not already present, and then the portion of the diffusion masking layer on the opposite major surface which is opposite the groove is removed prior to the diffusion operation.

Advantages of the invention are evident in the use of the so-called stepwise etching with subsequent diffusion in which doping substances then penetrate into the semiconductor body to different extents at different locations. Semiconductor devices produced according to the present invention furthermore exhibit a good yield and can be easily installed because the solder escaping during installation is collected by the grooves and thus no short-circuit paths can be created.

DETAILED DESCRIPTION OF THE PREFERRED EMBODIMENTS

Figure 1A:
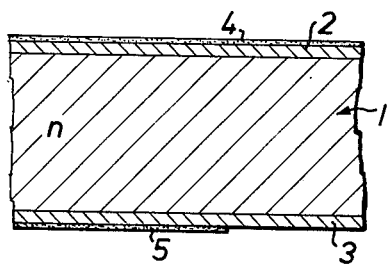
FIGS. 1a and 1e are a schematic representation of the process sequence for the manufacture of a thyristor with integrated diode in a silicon semiconductor wafer utilizing the process according to the invention.

Referring now to the drawing wherein the same elements are identified with the same reference numerals in all figures and the semiconductor wafer is shown as part of a radial sectional view, the invention will now be described for the production of a semiconductor device containing a thyristor with an integrated diode.

Figure 1B:
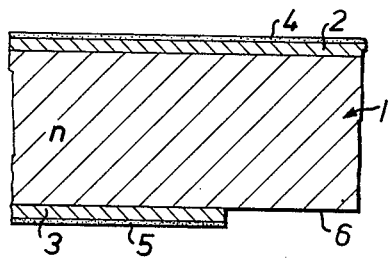

The basis for a thyristor with integrated diode may be, for example, a weakly doped semiconductor wafer 1, e.g., of silicon, which is of n-type conductivity as shown in FIG. 1a, and which has a thickness of about 200μ. On both major surfaces of semiconductor wafer 1, a dense layer 2 and 3 of silicon oxide is first produced in a known manner. With the use of a photolacquer or screen print lacquer technique the oxide layers 2 and 3, which are to serve as diffusion masking layers, are covered with layers 4 and 5, respectively, of a lacquer which is to serve as an etching mask, with the exception that the oxide layer 3 is not covered by the coating 5 in an annular edge region of the wafer 1. As shown in FIG. 1b, the exposed portion of the oxide layer 3 is then etched away from the major surface with the aid of hydrofluoric acid or any etching media containing hydrofluoric acid.

Figure 1C:
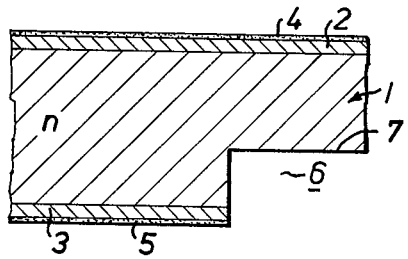

The semiconductor wafer 1 of FIG. 1b which now has a mask on one major surface is now ready for a subsequent etching step of the wafer. In this etching step, an annular groove 7 is etched out of the edge region of the semiconductor wafer 1 at 6 as shown in FIG. 1c. The etching depth in the illustrated embodiment is about 40μ. The etching medium employed in this etching step is one which has an etching rate many times higher for the silicon of the wafer 1 then for the oxide of the layers 2 and 3, and thus is a weaker etching medium than that used to remove the portion of layer 3. For example, the etching medium used here may be a mixture of nitric acid and hydrofluoric acid. In this manner, it is assured that in the subsequent diffusion steps the oxide layers 2 and 3 are still kept sufficiently intact. The remaining, annular edge region of semiconductor wafer 1 at 6 is now prepared for the formation of the zone structure for the diode which will be integrated in the finished device and is therefore called the diode ring. The central region of the semicondutor wafer is now prepared for the formation of the zone structure for the thyristor.

After removal of the lacquer layers 4 and 5, the semiconductor wafer of FIG. 1c is subjected to a first diffusion operation wherein both an acceptor and a donor doping substance are simultaneously diffused into the semiconductor wafer, with one of the doping substances being of the type which is capable of readily diffusing through the oxide layers 2 and 3, i.e., the oxide layers do not act as an effective diffusion mask for the doping substance. In the illustrated embodiment wherein the wafer is of n-type conductivity, the acceptor doping substance is chosen so tht it is not masked by the oxide layer and is, for example, gallium, while the donor doping substance may be phosphorus or antimony.

Figure 1D:
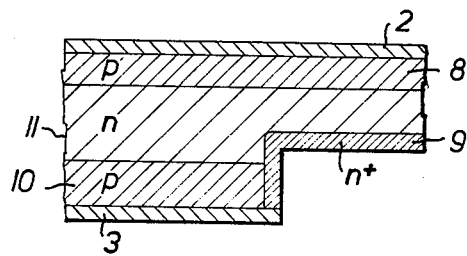

In the preferred embodiment in this first diffusion step gallium and phosphorus are diffused simultaneously into the masked semiconductor wafer 1 at its two major surfaces during a diffusion period of only 10 hours and at a temperature of 1250° C. This forms the zone structure shown in FIG. 1d wherein the two p-type conductivity zones 8 and 10 are formed by diffusion of the gallium through the oxide layers 2 and 3 and the n+-type conductivity zone 9 is formed by diffusion of the phosphorus. Subsequently the oxide layer 2 is again masked by means of known photolacquer or screen printing techniques and a diffusion window 13 is etched into the oxide layer 2 in order to be able to form the cathode zone 12 for the thyristor in the central region of the wafer 1. Thereafter the cathode zone 12 is formed in a second diffusion step wherein gallium and phosphorus are again simultaneously diffused for about 12 hours resulting in the finished zone structure of FIG. 1e for the thyristor and diode elements integrated in wafer 1.

Figure 1E:
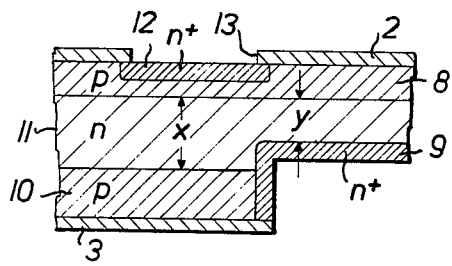

In the second diffusion step the doping substances diffused into the wafer during the first doping step continue to diffuse further into the wafer. FIG. 1e shows that in the finished device the p-type conductivity zone 8 and the n-type conductivity zone 11, which is the non-additionally doped portion of the basic semiconductor wafer 1, are common zones for the thyristor and the diode with zone 11 having the prescribed reduced thickness in the region of the semiconductor body 1 constituting the diode. This reduction in thickness x — y can be freely selected, with a given thickness of zone 9, by the etching depth of groove 7. In the illustrated embodiment the p-type zones 8 and 10 have a thickness of about 60μ while the n-type conductivity cathode zone 12 of the thyristor has a thickness of about 30μ and the n+-type conductivity cathode zone 9 of the diode has a thickness of about 40μ.

Figure 2A:
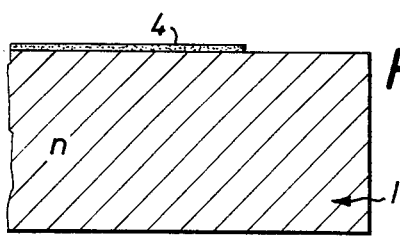
FIGS. 2a to 2g are a schematic representation of the process sequence for a manufacturing process according to the invention which has been modified from that shown in FIGS. 1a through 1e.
Figure 2F:
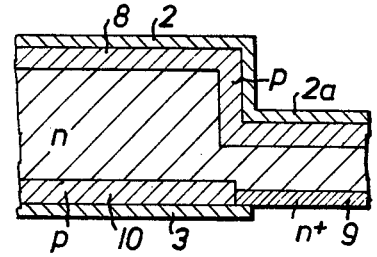
Figure 2B:
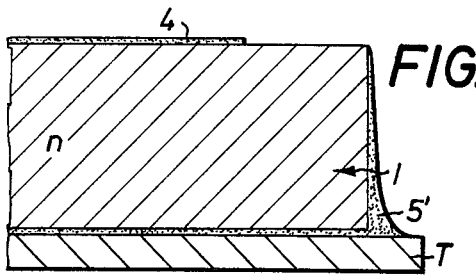
Figure 2C:
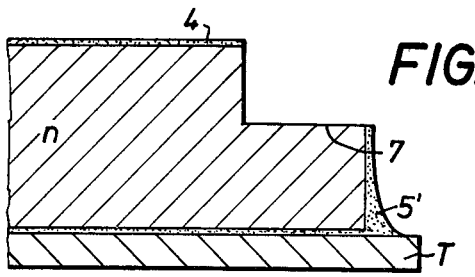

A thyristor with an integrated diode can also be produced in a modification of the process described above, as will be explained below with reference to FIGS. 2a-2g. In this case, as shown in FIG. 2a, the weakly doped semiconductor wafer 1 of n-type conductivity is provided on one major surface with a mask of an etch resistant photolacquer 4 or a screen-printed lacquer which leaves exposed the annular edge region of the wafer 1, and is attached by means of a screen-print lacquer 5' onto an etch resistant substrate T, e.g., of metal or quartz, as shown in FIG. 2b. The exposed edge region of the wafer 1 is then subjected to an etching process similar to that of the previously described embodiment so that the groove 7 is etched into the wafer and a so-called diode ring remains as shown in FIG. 2c. The wafer 1 is then removed from the substrate, the lacquer layers 4 and 5 are removed and, in contradistinction to the previously described embodiment, the semiconductor body 1 is now oxidized in a humid oxygen atmosphere to form the closed dense oxide layers 2, 2a and 3 as shown in FIG. 2d. As further shown in FIG. 2d, the oxide layer 3 is then covered with a layer 5 of photolacquer which leaves exposed the portion of the oxide layer 3 opposite the groove 7, i.e., at the diode ring, so that the exposed portion of oxide layer 3 can be etched away, After etching of the exposed portion of oxide layer 3, as shown in FIG. 2e, the diode ring is exposed at the major surface of the wafer 1 on which the diffusion masking layer 3 and the etching masking layer 5 are disposed.

Thereafter, the layer 5 is removed and the semiconductor wafer is subjected to a first diffusion step as in the previously described embodiment. In particular, gallium and phosphorus are simultaneously diffused for about 10 hours at 1250° C so that the gallium is diffused into the wafer 1 through oxide layers 2, 2a and 3, and phosphorus is diffused into the exposed surface of the diode ring whereby the zone structure shown in FIG. 2f is obtained. At this point, the zone structure for the diode is already completely formed. The p-type conductivity zones 10 and 8 then have a thickness of about 40μ and the n+-type conductivity zone 9 has a thickness of about 30μ.

Figure 2G:
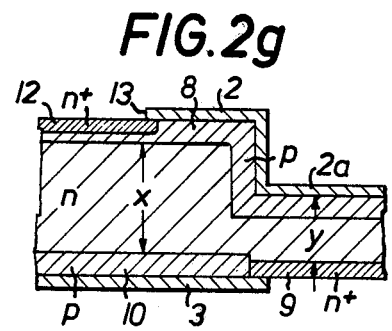
Figure 2D:
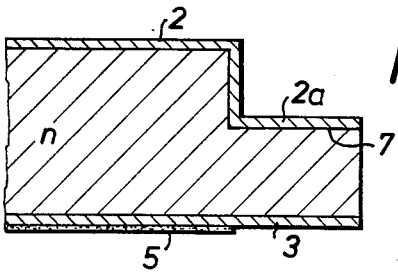
Figure 2E:
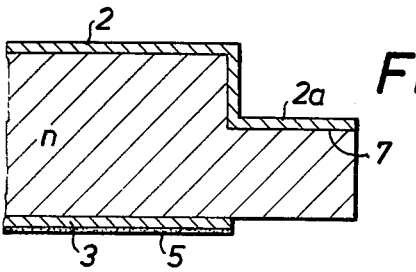

After opening a window 13 in the central region of the oxide layer 2, the finished zone structures of a thyristor and a diode integrated in semiconductor wafer 1 as shown in FIG. 2g are then completed in a second diffusion step, wherein gallium and phosphorus are again simultaneously diffused. During this second diffusion step the diffusion fronts produced in the first diffusion step again continue to penetrate further into the wafer. Common zones of the same conductivity type for thyristor and diode are represented by zones 11 and 8. In this process it can again be seen that the intended reduction x − y is determined substantially by the etching depth of groove 7 with a given thickness for zones 8 and 9.

It should be noted that although in the embodiment of FIGS. 2a-2g, the oxide masking layers 2 and 3 are preferably formed after the etching of the groove 7, it is to be understood that it is of course possible to form the oxide layers 2 and 3 prior to etching the groove 7 in the same manner as shown in FIGS. 1a-1c and to form only the oxide layer portion 2a subsequent to the etching operation. Such a procedure would however result in an increased number of process steps as compared to the sequence of steps shown in FIGS. 1a-1e. In the Embodiment of FIGS. 1a-1e and of FIGS. 2a-2g the n-dopants arsenic (As) or antimony (Sb) may be used instead of phosphorus (P) for the diffusion processes. In each diffusion step gallium and phosphorus are diffused simultaneously into the masked semiconductor wafer 1 with the donor substance (P) concentration greater then the acceptor (Ga) concentration.

In the finished zone structure of a thyristor and a diode integrated in semiconductor wafer 1, as shown in FIGS. 1e and 2g, the specific doping concentration of the n+-zone 9 and n+-zone 12 is, for example, approximately $10^{20} cm^{-3}$, whereas the doping concentration of the n-zone 11 is approximately $10^{14} cm^{-3}$, and the specific doping concentration ot the p-zone 8 and p-zone 10 is, for example, approximately $5 \cdot 10^{18} cm^{-3}$.

The etching medium employed in the step for etching out the annular groove 7 is a mixture of seven parts of 49 percent hydrofluoric acid, nine parts of 98 percent nitric acid and fourteen parts of 96 percent acetic acid. This etching step will take about 2 minutes time with the etching medium at a temperature of 27° C to etch out the groove 40 μm deep.

Hydrofluoric acid, as specified above, is employed for etching an oxide layer, the etching rate being about 2 μm per one minute.

In the embodiment of the FIGS. 2a-2g the semiconductor body 1 is oxidized in a humid oxygen atmosphere for 4 hours, preferably at a temperature between 1000° C to 1200° C.

It will be understood that the above description of the present invention is susceptible to various modifications, changes and adaptations, and the same are intended to be comprehended within the meaning and range of equivalents of the appended claims.

What is claimed is:

1. In a process for producing a semiconductor device having elemental semiconductor units monolithically integrated in a semiconductor body, with said units having a common or a plurality of common zones of one conductivity type with locally reduced thickness and pn-junctions between zones of different conductivity types, and process including the steps of forming a diffusion masking layer on both major surfaces of a semiconductor body of a first conductivity type, removing the portion of said diffusion masking layer on one of said major surfaces which is over the region of said semiconductor body which is to contain the zone of locally reduced thickness in the finished device and, producing the zone structures of the elemental units by diffusing doping substances into the semiconductor body from one and/or both major surfaces in time stages utilizing said masking layers; the improvement comprising, prior to said diffusing step, etching the portion of one of said major surfaces which is over the region of said semiconductor body which is to contain the zone of locally reduced thickness in the finished device to form a groove of desired depth in said semiconductor body with said depth being determined by the intended local reduction in the thickness of the common zone of the elemental semiconductor units in the finished device; and wherein said diffusing step includes subjecting said semiconductor body to a diffusion process for the simultaneous diffusion of a donor and an acceptor doping substance, with one of said doping substances being of the type for which the material of said masking layer is not an effective diffusion mask and being of a concentration sufficiently lower than that of the other doping substance, to cause said one doping substance to diffuse into the portions of both major surfaces of said semiconductor body covered by said masking layers to form zones of one conductivity type and said other doping substance to diffuse into any unmasked portions of said major surfaces to form zones of the opposite conductivity type.

2. A process as defined in claim 1 wherein said one doping substance is gallium and said material of said masking layer is a silicon oxide.

3. A process as defined in claim 2 wherein the other doping substance is antimony or phosphorus.

4. A process as defined in claim 1 wherein said step of etching includes subjecting said semiconductor body to an etching medium which has an etching rate which is many times larger for the basic semiconductor material of said semiconductor body than for the material of said masking layer.

5. A process as defined in claim 1 wherein said step of etching is carried out after said step of removing and comprises etching the unmasked portion of said one major surface to form said groove.

6. A process as defined in claim 5 further comprising: prior to said diffusing step, covering the surface of the groove with a dense layer of said masking material and removing the portion of the masking layer on the other of said major surfaces which is opposite said groove.

7. A process as defined in claim 5 further comprising: prior to said diffusing step, covering the surface of said groove with a dense layer of said masking material; and, etching the other of said major surfaces of said semiconductor body and opposite said groove formed in said one major surface.

8. A process as defined in claim 1, wherein: said step of etching is carried out before said step of forming a diffusion masking layer; said step of forming a diffusion masking layer includes covering the surface of the groove with said diffusion masking layer; and said one of said major surfaces from which a portion of the masking layer is removed is the major surface which is opposite the major surface containing said groove.

9. A process for producing a semiconductor device in which a thyristor and a diode are monolithically integrated in a semiconductor body and have a p-type conductivity zone and an n-type conductivity zone in common of which one of said common zones has a reduced thickness in the diode portion of the semiconductor body, said process comprising the steps of:
providing a weakly doped semiconductor body of a first conductivity type;
forming a dense diffusion masking layer on each of the two major surfaces of the semiconductor body;
applying a photolacquer or screen-print lacquer etch resistant layer over the entire surface of each of said diffusion masking layers except for the portion of one of said diffusion masking layers above the region of the seniconductor body in which the zone structure of the diode is to be formed;
etching the exposed portion of said one of said diffusion masking layers with a first etching medium to remove said exposed portion and expose the underlying portion of one of said major surfaces of said semiconductor body;
etching the exposed portion of said one major surface of said semiconductor body with an etching medium which has an etching rate which is many times larger for the semiconductor material of said body than for the material of said masking layer to form a groove of predetermined depth in said one major surface;
removing said etch resistant layers;
simultaneously subjecting both major surfaces of said semiconductor body for a predetermined time to a diffusion of a first doping substance, which produces zones of the opposite conductivity type in said semiconductor body and for which the material of said diffusion masking layer is not an effective diffusion mask, and of a second doping substance, which produces zones of said first conductivity type in said semiconductor body and which is at a sufficiently higher concentration than said first doping substance, in order to simultaneously form opposite conductivity type zones adjacent body said major surfaces beneath said diffusion masking layers and a more highly doped zone of said first conductivity type adjacent the exposed portion of said one major surface;
opening a window in the diffusion masking layer on the other of said major surfaces above the associated opposite conductivity type zone and in the region of the semiconductor body in which only the thyristor is to be formed; and
subjecting said semiconductor body to a diffusion of at least said second doping substance to form, via said window, a zone of said first conductivity type in said associated opposite conductivity type zone adjacent said other major surface.

10. A process as defined in claim 9 wherein: said first conductivity type is n-type conductivity; the material of said diffusion masking layer is a silicon oxide; and said first doping substance is gallium.

11. A process for producing a semiconductor device in which a thyristor and a diode are monolithically integrated in a semiconductor body and have a p-type conductivity zone and an n-type conductivity zone in common with one of said common zones having a reduced thickness in the diode portion of the semiconductor body, said process comprising the steps of:
providing a weakly doped semiconductor body of a first conductivity type;
forming an etch resistant masking layer on at least one major surface of said semiconductor body which leaves exposed the portion of said one major surface above the region of said semiconductor body in which the diode is to be formed;
etching the exposed portion of said one major surface to form a groove therein of a predetermined depth;
removing said etch resistant layer;
covering both major surfaces of said semiconductor body, including the surfae of said groove, with a diffusion masking layer;
removing a portion of the masking layer on the other of said major surfaces to expose the portion of said other major surface which is opposite said groove;
simultanteously subjecting both major surfaces of said semiconductor body for a predetermined time to a diffusion of a first doping substance, which produces zones of the opposite conductivity type in said semiconductor body and for which the material of said diffusion masking layer is not an effective diffusion mask, and to a second doping substance, which produces zones of said first conductivity type in said semiconductor body and which is at a sufficiently higher concentration than said first doping substance in order to form opposite conductivity type zones adjacent both said major surfaces beneath said diffusion masking layers and a more highly doped zone of said first conductivity type adjacent the exposed portion of said other major surface;
opening a window in the diffusion masking layer on said one major surface above the associated opposite conductivity type zone in the region of said semiconductor body in which only the thyristor is to formed; and
subjecting said semiconductor body to a diffusion of at least said second doping substance to form, via said window, a zone of said first conductivity type in said associated opposite conductivity type zone adjacent said one major surface.

12. A process as defined in claim 11 wherein: said first conductivity type is n-type conductivity; the material of said diffusion masking layer is a silicon oxide; and said first doping substance is gallium.

* * * * *